(12) United States Patent
Galli et al.

(10) Patent No.: US 7,010,441 B2
(45) Date of Patent: Mar. 7, 2006

(54) METHOD AND SYSTEM FOR IMPROVED SINGLE-ENDED LOOP MAKE-UP IDENTIFICATION

(75) Inventors: Stefano Galli, Morristown, NJ (US); Kenneth J. Kerpez, Long Valley, NJ (US)

(73) Assignee: Telcordia Technologies, Inc., Piscataway, NJ (US)

(*) Notice: Subject to any disclaimer, the term of this patent is extended or adjusted under 35 U.S.C. 154(b) by 38 days.

(21) Appl. No.: 10/845,865

(22) Filed: May 14, 2004

(65) Prior Publication Data

US 2004/0230390 A1 Nov. 18, 2004

Related U.S. Application Data

(60) Provisional application No. 60/470,815, filed on May 15, 2003.

(51) Int. Cl.
*G01R 13/00* (2006.01)
(52) U.S. Cl. .............................. 702/66; 702/57; 702/67; 702/71
(58) Field of Classification Search .................. 702/66, 702/69–71, 74, 87, 97, 117, 180, 183; 375/220, 375/224; 379/3; 709/232; 370/442, 445; 374/170
See application file for complete search history.

(56) References Cited

U.S. PATENT DOCUMENTS

| | | | | |
|---|---|---|---|---|
| 4,525,789 | A * | 6/1985 | Kemper et al. | 702/117 |
| 6,668,041 | B1 * | 12/2003 | Kamali et al. | 379/1.04 |
| 6,724,859 | B1 | 4/2004 | Galli | 379/1.04 |
| 6,744,854 | B1 * | 6/2004 | Berrier et al. | 379/22.03 |
| 2003/0016770 | A1 * | 1/2003 | Trans et al. | 375/346 |

OTHER PUBLICATIONS

Stefano Galli, et al., "Loop Makeup Identification Via Single Ended Testing: Beyond Mere Loop Qualification", IEEE Journal Selected Areas in Communications, pp. 923-935, vol. 20, No. 5, Jun. 2002.

Tom Bostoen et al., "Estimation of the Transfer Function of a Subscriber Loop by Means of a One-Port Scattering Parameter Measurement at the Central Office", IEEE Journal On Selected Areas in Communications, pp. 936-948, vol. 20, No. 5, Jun. 2002.

Kee Bong Song, et al., "Dynamic Spectrum Management for Next-Generation DSL Systems", IEEE Communication Magazine, pp. 101-109, vol. 40, No. 12, Oct. 2002.

* cited by examiner

*Primary Examiner*—Marc S. Hoff
*Assistant Examiner*—Felix Suarez
(74) *Attorney, Agent, or Firm*—William A. Schoneman; Joseph Giordano

(57) ABSTRACT

In a method and system for determining the composition of a subscriber loop, the method consists of analyzing the echo responses generated by the transmittal of pulses onto the subscriber loop. In the method, discontinuities along a loop are identified sequentially by comparing the measured waveform to waveforms generated on the basis of a hypothesized topology. The best match for the waveform is identified using a maximum likelihood approach and a maximum a-posteriori probability (MAP) estimator using observed knowledge regarding the loop plant. A multiple path search is also utilized to improve results and reduce computation time. Once the generated waveform that best matched the measured data had been found and a discontinuity identified, the waveform generated is subtracted from the measured data to produce a compensated waveform, which is used to detect the location and cause of the next echo. A calibration method is implemented to further improve data acquisition.

10 Claims, 8 Drawing Sheets

METHOD AND SYSTEM FOR IMPROVED SINGLE-ENDED LOOP MAKE-UP IDENTIFICATION

CROSS REFERENCE TO RELATED APPLICATION

This application claims the benefit of priority of U.S. provisional application No. 60/470,815 filed on May 15, 2003, entitled "Method and System for Single Ended Maximum Likelihood Loop Make-up Identification." This application is related to U.S. Pat. No. 6,538,451 entitled "Single Ended Measurement Method and System For Determining Subscriber Loop Make Up" and U.S. Pat. No. 6,724,859 entitled "Method For Determining Subscriber Loop Make-Up By Subtracting Calculated Signals" which are both assigned to the assignee of the present invention and are hereby incorporated by reference. This application is also related to U.S. patent application Ser. No. 09/676,840 entitled "System and Circuitry for Measuring Echoes on Subscriber Loops".

FIELD OF THE INVENTION

The present invention relates generally to communication networks, and more particularly, to the identification of the components in a subscriber loop in the public switched network using single-ended measurement techniques.

BACKGROUND

The telecommunications industry has worked for over a decade to develop digital subscriber line (DSL) technologies to revitalize the embedded copper plant. Now the industry is on the threshold of reaping the benefits of this effort, bringing megabit-per-second connectivity to offices and homes. However, network providers must properly manage the introduction and application of these systems to the local network. Accurate engineering is critical to avoid provisioning failures that would otherwise create customer disappointment, delay and higher costs. An understanding of subscriber loop make-ups, including length, wire gauge and location of bridged taps, is key to the proper engineering of DSL systems. While some loop records exist, they may be inaccurate or out of date. Knowing the types of systems that are transmitting in a given cable is also critical, because of the resultant crosstalk and the potential need for spectrum management.

High-speed DSL access for small business and residential customers is one of the most important new services currently being offered by network and service providers. To date, DSL service providers are still in need of an advanced loop qualification system that can minimize qualification errors. Loop qualification consists of determining whether a loop can support DSL services or not and, generally, the estimate of the transfer function of the loop is sufficient for such purposes. Successful loop qualification is perhaps the most critical step in signing up new customers. Loop make-up identification will allow operators to pre-qualify a loop for DSL service, and also to update and reorder telephone company loop-records, which can be accessed to support engineering, provisioning and maintenance operations.

Among the new techniques being used to upgrade the public network are access technologies that use the embedded copper plant to support higher bandwidth services. These technologies include ISDN, HDSL, ADSL, SHDSL, ADSL2+, VDSL and others for which carriers have announced aggressive deployment plans. The new DSL technologies have the potential to become strategically important to an operator's business plans. While they have proven robust in trials, any new technology, no matter how powerful and reliable, must be properly deployed. This involves several engineering tasks including loop qualification and spectrum management. Loop qualification consists of knowing what type of DSL system and what bit-rate can be successfully and reliably provisioned on a given customer's loop. This is based on loop composition data.

Maintaining accurate records of the loop plant is important to many aspects of an operator's business. Beyond supporting traditional voice services, even more accurate and detailed loop records are needed when deploying DSL-based services. POTS services generally only require that loops meet Revised Resistance Design (RRD) rules (up to about 18 kilofeet). DSL technologies are capable of transmitting variable rates, and admit different service levels on different loops.

Several approaches and tools are being developed to facilitate loop qualification. The most common is mining existing data in loop databases, checking it for accuracy, and then bulk-provisioning loops that are candidates for DSL-based service. Sometimes a combination of loop records and engineering information about feeder route topology is used to obtain an estimate of loop length. Another technique uses loop loss measurements from traditional POTS loop testing systems to estimate loop length. These approaches use good engineering judgment and result in large populations of loops that are likely candidates to support advanced services. However, a typical approach is to minimize customer disappointment by biasing the techniques toward low probabilities of false-positive results. This is done at the expense of increasing the probability of false-negative results. In other words, the approaches are conservative, and some loops that might support DSL service remain unused or run at low bit-rates. Other loop qualification methods use the adaptation settings of a modem operating over the subscriber loop of interest. For example, if a DSL system is operational, the adaptive filter settings contain useful information about the loop. This approach has the disadvantage that a DSL system must first be in operation on the loop which one hopes to qualify. Other techniques use standard dial-up modems that operate over any subscriber loop to glean voice-band information about the loop, in order to predict performance at the higher frequencies of interest to DSL.

It would be desirable to have a single-ended testing technique that could estimate the transfer function or identify (and, therefore, qualify) all nonloaded subscriber loops without the need for special equipment or intervention at the subscriber's location. Loop make-up identification implies loop qualification and also allows telephone companies to update and correct their loop plant records. Therefore, accurate loop make-up identification can further be used to update records in loop databases, where records can in turn be accessed to support engineering, provisioning and maintenance operations. The importance of this capability is also confirmed by the creation of a new project in ITU-T SG15 Q4 on single-ended loop test (G.selt). G.selt modems will report single-ended measurements from a single DSL modem, before DSL service is activated or to analyze DSL lines that aren't working. G.selt modems may measure frequency dependent impedance, TDR signals, noise spectrum at the CO, impulse noise counts, etc. This may be done to determine: loop length, loop make-up, crosstalker types, crosstalk couplings, radio ingress, impulse noise, linearity, SNR and bit-rate capacities, load coils, etc. G.selt modems are likely to provide data to a separate analysis engine, which interfaces with a DSL Operating Support System.

Despite its importance, there is little published research on algorithms or techniques that allow loop make-up identification or even channel transfer estimation via single-ended testing. In "Estimation of the Transfer Function of a Subscriber Loop by Means of a One-Port Scattering Parameter Measurement at the Central Office" by T. Bostoen, et al., IEEE J. Select Areas Commun., pp. 936–948, it is proposed to use the one-port scattering parameter to achieve channel transfer function estimation when a priori information on the loop topology is available. Although this technique provides good results on short/medium length loops, the assumption that some or all the loop topology is known prior to testing may limit the practical applicability of this technique.

In Time Domain Reflectometry (TDR) approaches, i.e. probing signals are transmitted onto the loop and echoes reflected by impedance changes are analyzed to infer the unknown loop topology. Previous attempts to use TDR techniques, sometimes coupled to artificial neural network algorithms, have failed due to the difficulty of the post-processing of the TDR trace needed to extract all loop. Moreover, conventional metallic TDRs are not capable of detecting all echoes. In fact, conventional metallic TDRs cannot detect gauge changes and, moreover, have a serious range limitation that prevents them from detecting reliably echoes farther than several kilofeet (kft) from the Central Office (CO). This limitation is essentially due to two reasons: conventional TDR methods use unbalanced probing thus allowing for limited common mode rejection capability; there is a slowly decaying signal (SDS) caused by the distributed RLC nature of the loop, that overlaps with and masks the echoes generated by impedance changes.

Accurate TDR measurements alone are not sufficient without an algorithm able to extract information from the TDR trace. In particular, a major problem arises in a TDR approach since observations available at the receiver consist of an unknown number of echoes, some overlapping, some not, some spurious, some not, that exhibit unknown amplitude, unknown time of arrival and unknown shape. The resolution of such echoes via a single sensor (and not an array) is very complicated and has seldom been addressed. Real echoes are defined herein as he echoes pertaining to initial encounters with discontinuities, whereas we define as spurious echoes all the echoes caused by successive reflections. The necessity of separating echoes in two categories ("real" and "spurious") is irrelevant for modeling issues, but it becomes important when loop identification is attempted. In fact, any identification algorithm must be able to discriminate between real echoes (the echoes that indicate the actual presence of a real discontinuity) and spurious echoes (the re-reflected and artificial echoes that do not indicate the presence of a discontinuity In commonly-assigned U.S. Pat. No. 6,538,451 entitled "Single Ended Measurement Method and System For Determining Subscriber Loop Make Up" to Galli et al., a method and system for determining the make-up of a subscriber loop by sending pulses onto a loop and acquiring data based on received echo signals caused by discontinuities as a pulse traverses a loop is disclosed. Note that Galli is also a co-inventor on the present invention. Although the Galli method is able to determine loop makeup more accurately and overcomes the prior art problems highlighted above, the method does have some shortcomings. First, the method works well only where the loop is less than approximately 8,000 feet (8 kft). Once the length of the loop increased significantly beyond 9 kft the method is not able to identify loop discontinuities with the same success because of noise enhancement due to the use of the reciprocal of the insertion loss. Second, Galli's method may not achieve unambiguous loop make-up identification if the topology of the loop under test does not belong to the set of "well-behaved" loops, i.e., loops that follow the recommended design rules.

In U.S. Pat. No. 6,724,859 entitled "Method For Determining Subscriber Loop Make-Up" to Galli ("Galli II") this issue was overcome. In Galli II, the inductive effect of a subscriber loop was taken into account when processing echo signals that are the result of probing the loop with pulses by removing the slowly decaying signal caused by the inductive effect of the loop from the echo signals. Accordingly, the echo signals are no longer masked by the slowly decaying signal thereby increasing the accuracy and range of a measurement system built in accordance with the present invention. The input impedance of the loop as a function of frequency was used in the process of identifying discontinuities and other features represented by the echo signals. This is accomplished by first calculating the input impedance of the loop as a function of frequency. The input impedance of the loop is then convolved, in the frequency domain, with the Fourier transform of the probing signal. Finally, a simulated waveform of the discontinuity in the time domain is obtained by inverse Fourier transforming the result of the convolution. This simulated waveform is then compared to the actual echo signal caused by the discontinuity. If the comparison yields an acceptable match, e.g., within a predetermined error margin, then the discontinuity is identified and the signal corresponding to that discontinuity is removed by subtracting the simulated waveform from the acquired data. This is done for each discontinuity encountered until the last discontinuity is identified using the maximum likelihood (ML) approach.

The prior approach does not take into account information that is known about the loop plant using a maximum a-posteriori probability (MAP) estimation. Therefore, it would be desirable to have a system and method that uses such a MAP estimation to use known loop plant information to increase the accuracy of the loop composition identification.

The prior approach successively estimated loop sections from a single previous estimate of the loop make-up. There was no way of recovering from errors made early in the process. Therefore, it would be desirable to have a system and method that builds on multiple estimates to allow recovery from errors and provide improved estimation.

SUMMARY

In the system and method of the present invention, the composition of a subscriber loop including a cable having one or more discontinuities is identified by transmitting a probing pulse on the loop and acquiring data based on receiving echoes caused by the discontinuities on the loop. A representative set of topologies of the loop based on the acquired data resulting from the discontinuities is hypothesized and a corresponding waveform for each of the hypothesized discontinuities is generated. Each computed waveform is compared to the acquired data and choosing the topology whose corresponding waveform best matches the acquired data using a multiple path search technique. Once the best match is chosen the waveform corresponding to the chosen topology is subtracted from the acquired data to produce compensated data. The compensated data is analyzed to determine if a next echo corresponding to an additional continuity is present in the compensated data. The steps of hypothesizing, computing, comparing and subtracting are iteratively performed for each discontinuity in the loop until no echoes are found. Using the set of best match waveforms the presence or absence and location of one or more gauge changes and bridged taps, the length of the loop including the length of each bridged tap, and the gauge of each loop section are identified.

The method and system of the present invention further improves on the prior art system by using a maximum a-posteriori probability (MAP) estimation to take into account knowledge regarding the loop plant to choose the topology whose corresponding waveform best matches the acquired data.

Additionally, a calibration technique is used to compensate the acquired data based on a calibration ratio and a null response for each gauge of cable tested.

DETAILED DESCRIPTION OF THE DRAWINGS

Figure 1A:
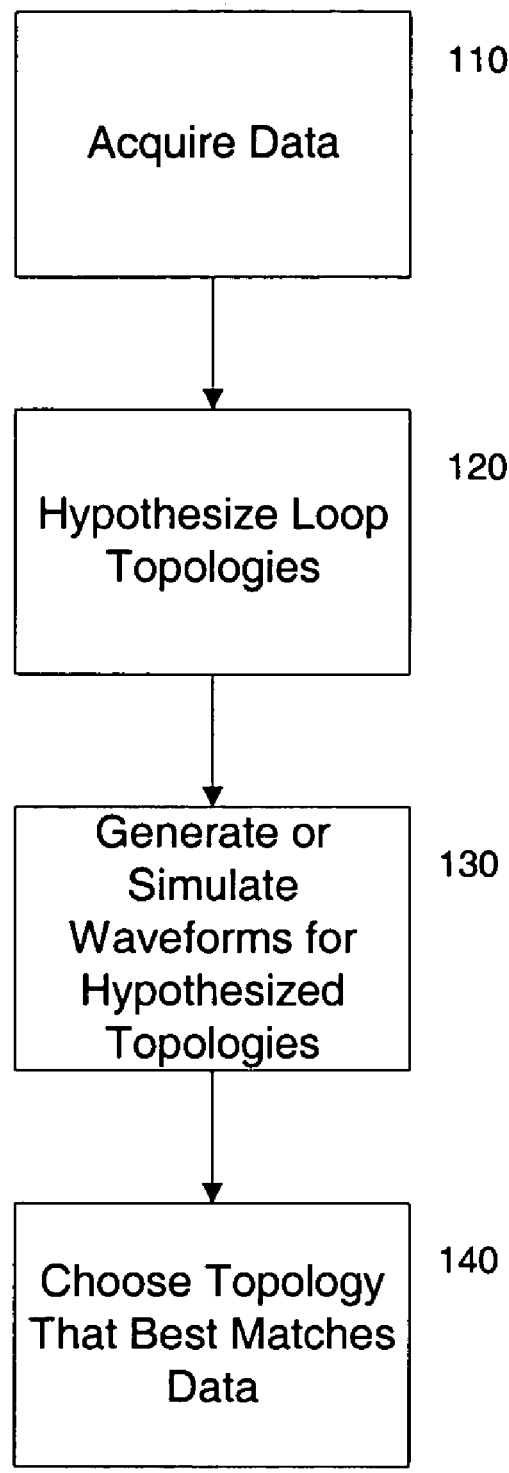
FIG. 1A is a high level flow chart that depicts the general method used in the present invention for loop identification.

Referring to FIG. 1A, the loop make-up identification algorithm of the present invention hypothesizes a discontinuity using auxiliary topologies, computes the simulated TDR trace that would be generated by the hypothesized topology using a mathematical model and, then, compares it with the observed data. In general, given a set of acquired data from step 110, the method proceeds to hypothesize a set of loop topologies at step 120 and, on the basis of the mathematical model, compute the waveforms that should be observed at the receiver if the hypothesized topologies were true at step 130. The topology corresponding to the waveform that best matches the observed signal is chosen as the "most likely" topology at step 140.

Once the location of a discontinuity has been found, there is a finite number of possible topologies that can be hypothesized. This suggests that a simple exhaustive search through all the possible topologies could be performed without requiring a prohibitive computational burden.

Figure 1B:
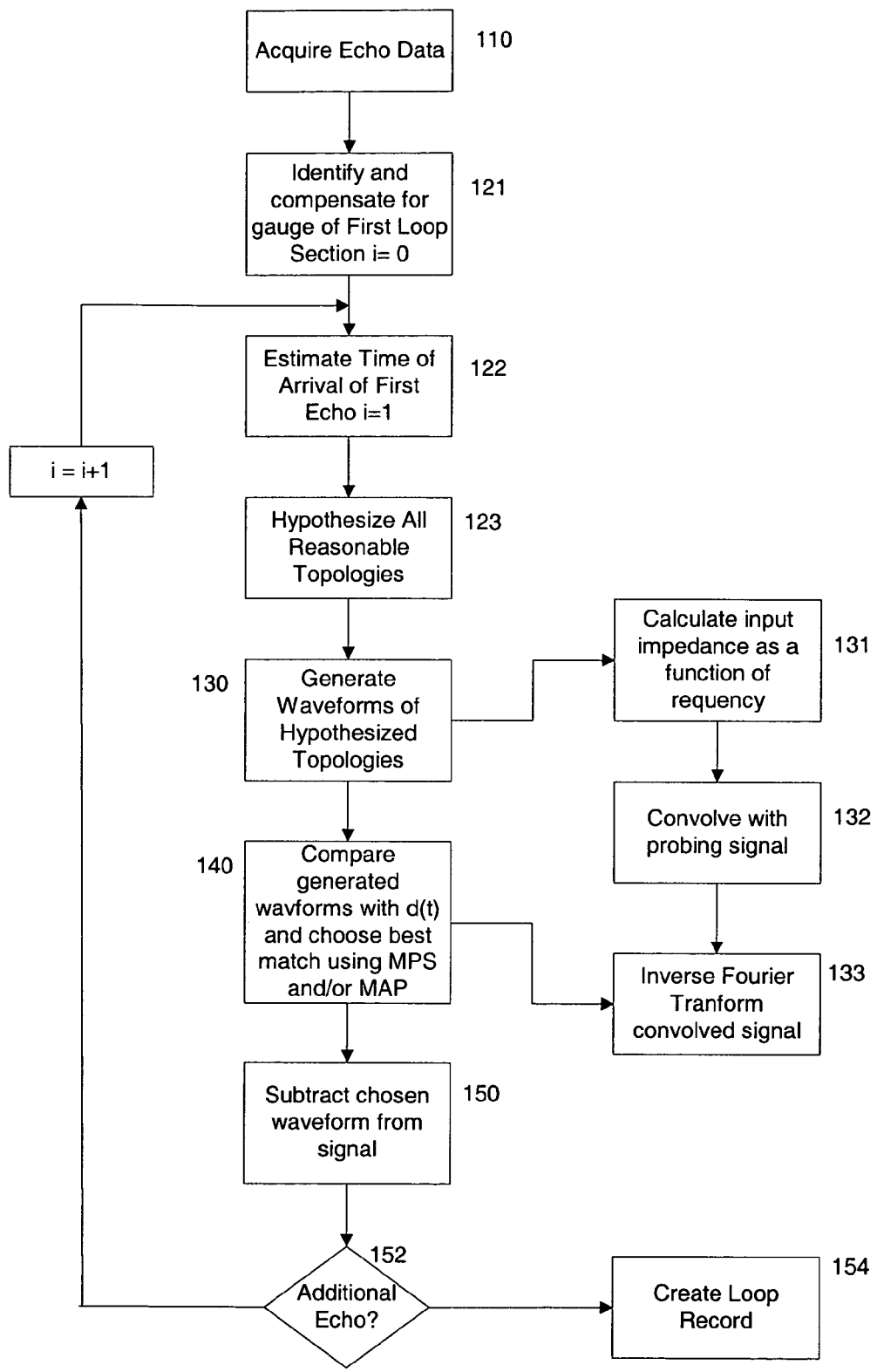
FIG. 1B is a detailed flow chart depicting the method of the present invention.
Figure 2:
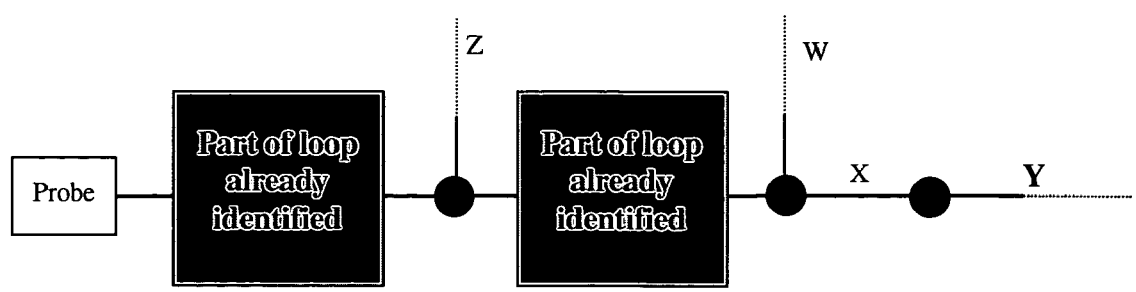
FIG. 2 depicts the types of loop topologies identified by the method and system of the present invention.

FIG. 1B depicts the detailed flow diagram of the method of the present invention. Data is acquired at step 110 of the process. The data acquisition techniques are well-known in the industry and have been detailed in the prior related patent applications set forth above. When hypothesizing a loop topology (step 120 of FIG. 1A) two situations must be distinguished: the beginning of the identification process (step i=0), or after an echo is detected (generic step i>0).

At step 121 i=0, the algorithm tries to identify the gauge of the first loop section by hypothesizing that the entire loop is a single section loop of infinite length and gauge X, X=19, 22, 24, 26. In so doing, four loop topologies are hypothesized, one for each possible gauge. Basically, in this step the algorithm estimates the SDS of the first loop section so that it is de-embedded from the measured TDR trace.

At generic step i of the identification process, a loop topology is hypothesized if an echo is detected. In more detail, the algorithm hypothesizes the presence of a gauge change, of a bridged tap, etc., located at a certain distance from the CO. This distance is computed after having estimated the time of arrival of the first echo contained in $e^{(i)}(t)$ at step 122. The set of hypothesized topologies depends on the sign of the detected echo and on the previously identified discontinuity. The sign of the echo allows us to understand if the loop section preceding the discontinuity exhibits a higher or lower characteristic impedance than the following loop section. This helps to narrow down all the possible discontinuities that can be hypothesized at step 123.

Also the discontinuities encountered before the discontinuity currently under identification determine the possible topologies that can be identified.

At step 130 a simulated waveform that represents each hypothesized topology is generated. The process for simulating a waveform for a topology is given by steps 131 through 133. First, the input impedance of the each hypothesized loop topology is calculated as a function of frequency at step 131. The calculated input impedance of each hypothesized loop topology is then convolved, in the frequency domain, with the Fourier transform of the probing signal at step 132. Finally, a simulated waveform for each hypothesized loop topology is obtained in the time domain by inverse Fourier transforming the result of the convolution at step 133.

The simulated waveforms of step 130 are compared to the remaining acquired or observed data signal, $e^{(i)}(t)$, and the simulated waveform that best matches $e^{(i)}(t)$ is chosen at step 140. There are many ways to determine what constitutes the "best match" or has the smallest error margin. The topology corresponding to the waveform that best matches the observed signal is chosen as the "most likely" topology. An index of the "closeness" between the hypothesized waveform and the observed one may be, for example, the Mean Square Error (MSE). In principle, if the model were exact and no form of noise were present, this procedure is able to identify exactly and flawlessly a loop. Obviously, noise is always present and the mathematical model, although precise, is not exact. Therefore, in practice, there is the possibility of making errors. In our work we chose the MSE as the metric for comparing the real data waveform and the simulated ones. A set of $N^{(i)}$ MSEs is computed between the acquired data waveforms and the simulated data waveforms, i.e., $e^{(i)}(t)=(d(t)-h^{(i)}(t))$, and the $N^{(i)}$ differences ($\{h_j^{(i)}(t)\}-h^{(i-i)}(t)$) between the waveforms pertaining to all the discontinuities topologies at step i and the waveform corresponding to the discontinuity topology identified at the (i−1)-th step.

At step 150 the chosen waveform is subtracted from the acquired input signal and the remaining signal is checked for any additional echo at step 152. If there are none a loop record is created at step 154. If there is an additional echo the iteration counter, i, is incremented and the process loops back to step 123.

In the improved method of the present invention a multiple path search ("MPS") is used to permit the loop ID algorithm to operate on more than one loop estimate simultaneously. This is structured as a search across paths of state-space transitions, where more than one path may be extended from a given state to the next state when finding each next discontinuity type. This extension will allow the ID algorithm to be more accurate in detecting the gauges of the loop sections. This idea can be though of as a tree search, where more than one branch or path is extended when finding each next discontinuity type (i.e., gauge change from 26 to 24 gauge, 26 to 22 gauge, . . . , 26 gauge bridged tap with 24 gauge next section, 24 gauge bridged tap with 22 gauge next section, . . . ). The next retained paths are those with the minimum mean squared error across all previous path estimates extended by all next discontinuity types. So, the next paths could all be different extensions of one previous path, or extensions of different previous paths, etc.

States are defined as different types of impedance discontinuities, i.e., gauge change 26 to 24 gauge, 26 to 22 gauge . . . , 26 gauge bridged tap with 24 gauge next section, 24 gauge bridged tap with 22 gauge next section, etc. If the next discontinuity has a bridged tap, then it is followed by a working section, consisting of two pairs connected to the estimated loop since the lengths of the next loop section are unknown. A state or discontinuity defined as a 26 gauge bridged tap and a 24 gauge next working section momentarily has the same response as a 24 gauge bridged tap and a 26 gauge next working section, for example, and so such redundant states are not included in the table of possible selections. A set of defined states is shown in Table 1. For speed, the cardinality of this set could be decreased by, for example, eliminating states with 19 gauge, or eliminating double bridged tap states.

TABLE 1

| State | Type of discontinuity | Gauge of next working section | Gauge of first bridged tap (if any) | Gauge of second bridged tap (if any) |
|---|---|---|---|---|
| 1 | Gauge change | 26 | | |
| 2 | Gauge change | 24 | | |
| 3 | Gauge change | 22 | | |
| 4 | Gauge change | 19 | | |
| 5 | Single bridged tap | 26 | 26 | |
| 6 | Single bridged tap | 24 | 26 | |
| 7 | Single bridged tap | 22 | 26 | |
| 8 | Single bridged tap | 24 | 24 | |
| 9 | Single bridged tap | 19 | 26 | |
| 10 | Single bridged tap | 22 | 24 | |
| 11 | Single bridged tap | 22 | 22 | |
| 12 | Single bridged tap | 19 | 24 | |
| 13 | Single bridged tap | 19 | 22 | |
| 16 | Double bridged tap | 24 | 26 | 26 |
| 17 | Double bridged tap | 22 | 26 | 26 |
| 18 | Double bridged tap | 24 | 24 | 26 |
| 19 | Double bridged tap | 19 | 26 | 26 |
| 20 | Double bridged tap | 22 | 24 | 26 |
| 21 | Double bridged tap | 24 | 24 | 24 |
| 22 | Double bridged tap | 22 | 22 | 26 |
| 23 | Double bridged tap | 19 | 24 | 26 |
| 24 | Double bridged tap | 22 | 24 | 24 |
| 25 | Double bridged tap | 19 | 22 | 26 |
| 26 | Double bridged tap | 22 | 22 | 24 |
| 27 | Double bridged tap | 19 | 24 | 24 |
| 28 | Double bridged tap | 19 | 19 | 26 |
| 29 | Double bridged tap | 22 | 22 | 22 |
| 30 | Double bridged tap | 19 | 22 | 24 |
| 31 | Double bridged tap | 19 | 22 | 22 |
| 32 | Double bridged tap | 19 | 19 | 24 |
| 33 | Double bridged tap | 19 | 19 | 22 |
| 34 | Double bridged tap | 19 | 19 | 19 |
| 35 | End of loop | — | — | — |

The process of computing the loop response model and comparing it to the data is computationally intensive. While the Viterbi algorithm could be used to implement the Maximum Likelihood (ML) path search through this state space, it is generally too complicated. So, a reduced complexity path search has been used here, although other path search methods could apply. Moreover, the formulation here differs from the usual use of the Viterbi algorithm. Here there are dependencies between the states because of impedance matching, particularly if the loop segments are short. So, the sum squared error (SSE) metric is recomputed at each iteration, instead of simply adding the SSE of the new transition to that of the last state.

Figure 3:
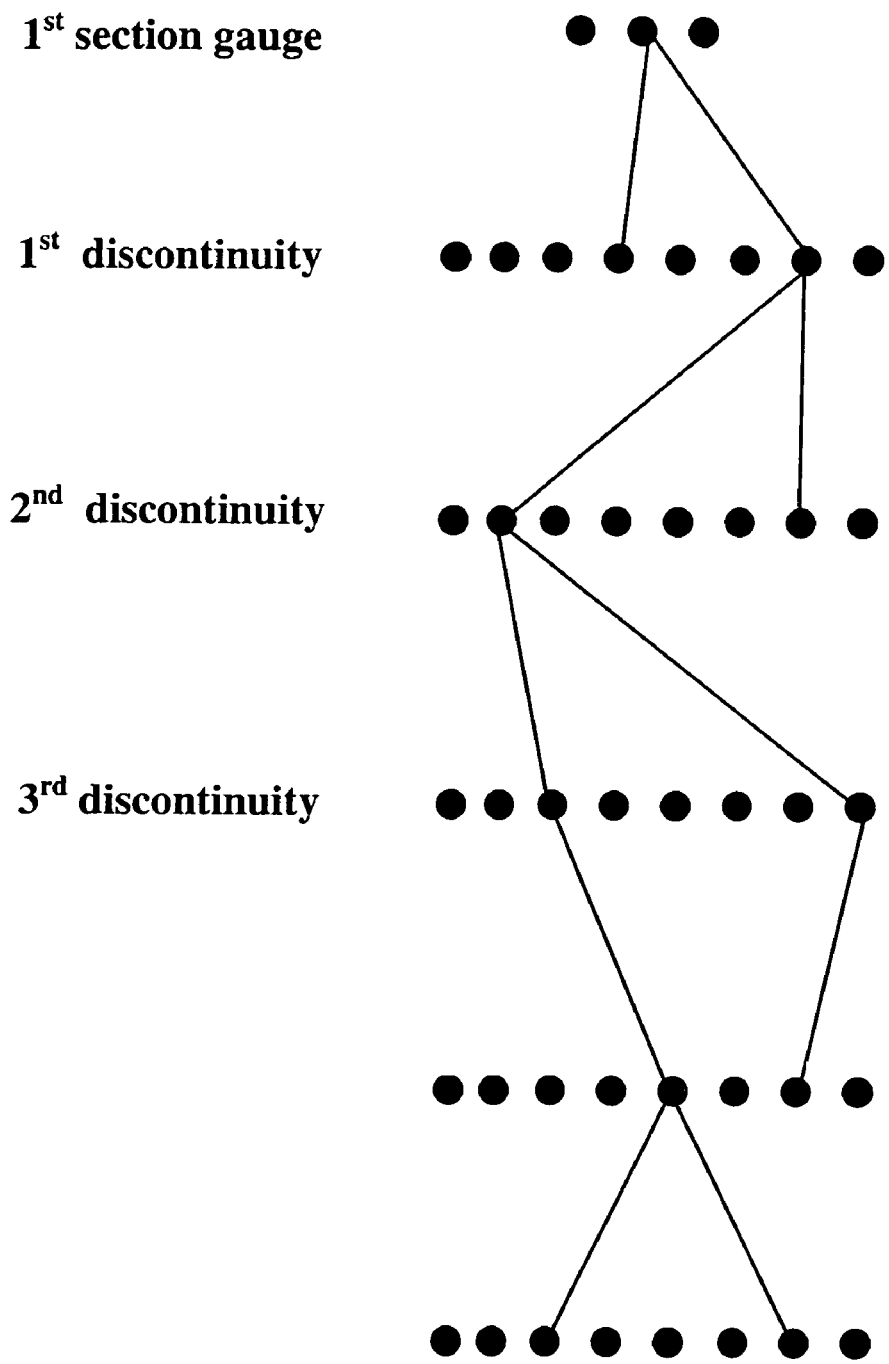
FIG. 3 schematically illustrates the multiple path search algorithm of the present invention.

The multiple path search procedure is illustrated in FIG. 3. The first loop section is simply estimated as being 19, 22, 24 or 26 gauge. The gauge with the minimum SSE between its model trace and the data is the first path, the gauge with the next lowest SSE is the second path, etc. The loop section lengths are estimated, then the next state or discontinuity is estimated. This is successively performed, building a loop estimate from the test head out. All existing paths are extended to all possible next states, and the retained paths are those with the overall minimum SSE across all previous path estimates extended by all next discontinuity types. So, the next paths could all be different extensions of one previous path, or extensions of different previous paths, etc. Some paths will terminate, and others will extend.

Tests showed that using multiple paths can help correct the wrong estimate of a path's loop section, because often that loop section estimate can later be swapped with that of another path. Typically only two or three paths are used, much fewer than the number of states. The current number of paths may increase if a bridged tap is found, to test both topologies with the end section a bridged tap and with the end section working. Branch and bound techniques are used to limit the complexity of the algorithm, e.g. the maximum number of paths is limited by truncating the number of paths when the next discontinuity type is found. When paths are extended, all parameters that correspond with the prior path must be properly assigned. Different path's loop estimates that are nearly the same (within about a hundred ft), can be replaced by the next best possible discontinuity estimate, with the next lowest sum squared error.

Use of a priori knowledge

If some a priori knowledge on the statistical distribution of the loop sections were known, the search could be performed more accurately and efficiently. For example, the algorithm could hypothesize the most recurrent topologies first so that the time needed for the determination of the gauge or for the determination of the kind of discontinuity can be reduced. A partial statistical characterization of the loop plant could be obtained by analyzing the loop records of the CO under test contained in the loop database.

A brief overview of statistics of the length and gauge of telephone loops in North America are presented in this section. These statistics provide general information about the loop plant that can be used to enhance loop make-up estimation. For example, it is shown that there is very little 19 gauge cable within measurement range of a CO, and that it is uncommon for a loop to have total bridged tap length above 5 kft. Equations for incorporating loop statistics in loop identification are presented at the end of this section.

Statistics from two North American loop surveys are primarily presented here: a 1983 loop survey and an internal Bellcore 1987–1990 loop survey. The 1983 loop survey had a sample of 2290 working loops at 17 different operating companies nationwide. A survey conducted by Bellcore in 1987–1990 sampled 559 loops at 101 wire centers across the USA. About 24% of the 1983 loop-survey loops were loaded, and about 28% of the Bellcore survey loops were loaded. While these loop surveys are somewhat dated, copper cable lengths and gauge as a function of length have not changed much in time.

Statistics of loop working lengths have been collected and Bellcore's 1987–1990 survey, and are compared here (lengths are in feet):

1983 Survey (Mean: 10,787)

Max: 114,103; 90%: —; 75%: 14,100; 50%: 8,890; 25%: 4,440

1987–1990 Bellcore Survey (Mean: 13,092)

Max: 90,000; 90%: 25,018; 75%: 18,330; 50%: 11,538; 25%: 5,799

Figure 4:
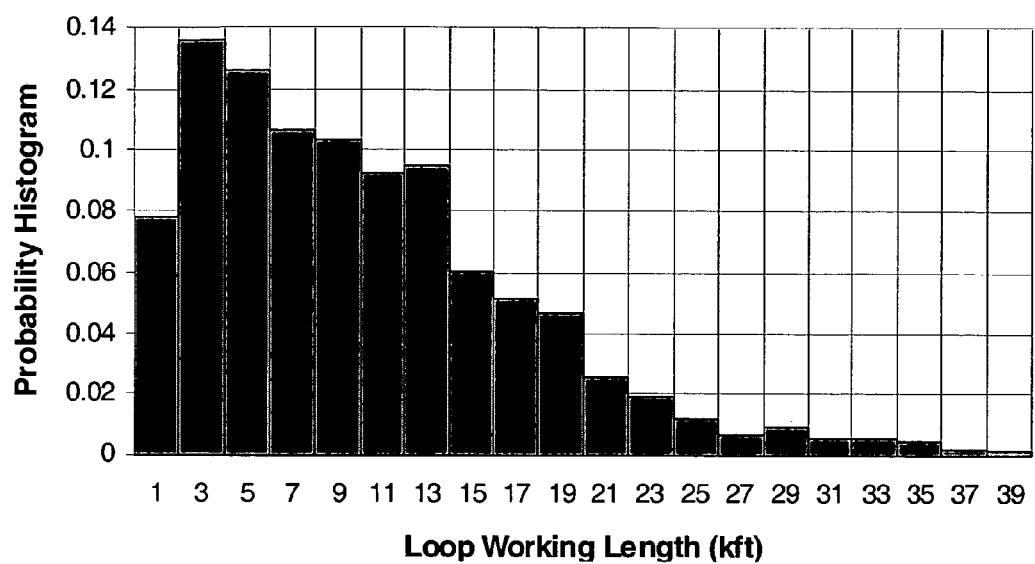
FIG. 4 depicts a relative probability histogram of loop working lengths.

The percentage value expresses the percentage of loops that have working length (feet) less than or equal to the table entry, e.g. the 50% value is the median. The mean, or average, loop working lengths in the Bellcore survey are generally a little longer than those in the 1983 loop survey. The 1983 loop survey gives frequency counts of loop working lengths in 2000 ft increments. The relative probability histogram of loop working lengths is shown in FIG. 4. The 1983 loop survey separated statistics for business and residential loops. The mean working length of business loops was 8816 ft, and the mean working length of residential loops was 11723 ft.

About 27% of the 1983 loop survey loops had no bridged tap. In contrast, 62.6% of the Bellcore survey loops had no bridged tap. Statistics of the total sum of all lengths of bridged taps on a loop with bridged tap are presented here (lengths are in feet):

1983 Survey (Mean: 1,299)

Max: 18,374; 90%: —; 75%: 1,760; 50%: 760; 25%: 150

1987–1990 Bellcore Survey (Mean: 1,250)

Max: 11,500; 90%: 3,100; 75%: 1,769; 50%: 728; 25%: 317

Figure 5:
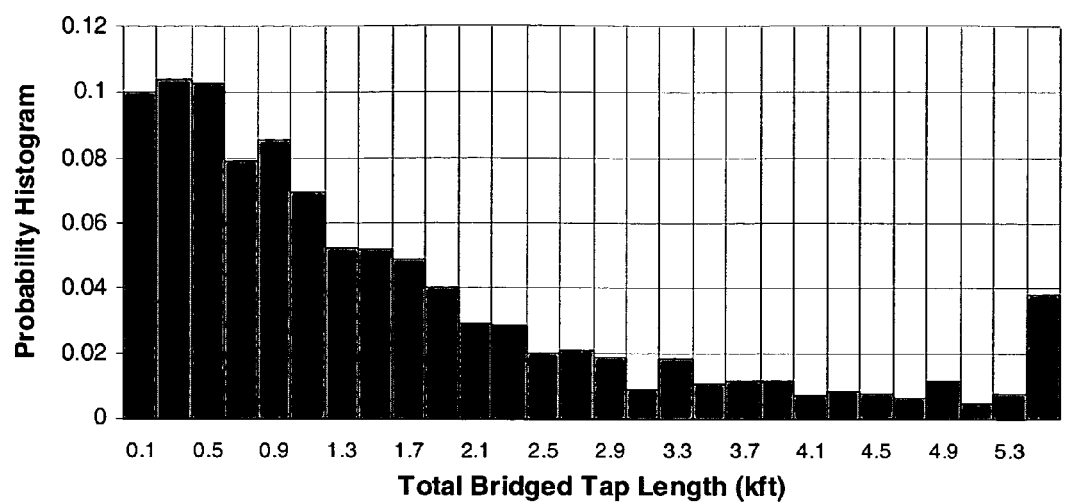
FIG. 5 depicts the probability histogram of total bridged tap lengths measured in the 1983 loop survey.

The percentage value expresses the percentage of loops that have total bridged tap length (feet) less than or equal to the table entry. The probability histogram of total bridged tap lengths measured in the 1983 loop survey is shown in FIG. 5.

In North America, telephone cables are either 26, 24, 22 or 19 American Wire Gauge (AWG). 26 gauge is the thinnest and 19 gauge is the thickest. 26 gauge is prevalent near the CO because it is sufficient for short distances. The thicker 24 and 22 gauge become more prevalent at increasing distances from the CO.

Cable gauge as a function of distance from the CO is presented in Table 2 for both the 1983 loop survey data the 1987–90 Bellcore survey data. The table also presents overall percentages including all segments of all surveyed loops. The 1987–1990 Bellcore loop survey also contained a large number of measured loop losses on CSA-compatible loops. These were presented as scatter plots of loop length versus loss at 40 kHz, 100 kHz, 200 kHz, and 300 kHz; and were plotted compared to the loss of pure 19, 22, 24, and 26 gauge. A few loops had about the same loss as pure 22 gauge. Many loops had worse loss than pure 26 gauge, particularly at high frequencies. This may be due to bridged taps. The average loop loss appeared to be approximately that of pure 26 gauge.

TABLE 2

| Distance from CO (kft) | % 26-gauge | | % 24-gauge | | % 22-gauge | | % 19-gauge |
|---|---|---|---|---|---|---|---|
| | 1983 | 1987–90 | 1983 | 1987–90 | 1983 | 1987–90 | 1983 |
| 0 | 72 | 67 | 22 | 25 | 6 | 8 | 0 |
| 5 | 53 | 53 | 35 | 34 | 12 | 13 | 0 |
| 10 | 30 | 27 | 51 | 52 | 18 | 21 | 1 |
| 15 | 16 | 4 | 46 | 62 | 36 | 34 | 2 |
| 20 | 2 | 2 | 34 | 38 | 60 | 60 | 4 |
| 26 | — | 2 | — | 7 | — | 90 | — |
| 30 | 0 | — | 10 | — | 69 | — | 21 |
| Overall | 40.4 | 37.8 | 35.6 | 40.4 | 21.3 | 21.7 | 2.7 |

The method and system of the present invention uses loop statistics such as that set forth above to enhance the accuracy of loop identification over a large population of loops at a wire center. For example, 19 or 22 gauge cable is unlikely close to a CO, and 26 gauge cable is unlikely far from the CO, so these should be weighted as being less probable. To make the estimation of the types of discontinuities more accurate, the loop make-up estimation procedure is extended here to incorporate the prior probabilities of statistics of cable gauge as a function of distance from the CO. Prior probabilities of cable gauges are given in Table 2 for North America. These cable gauge statistics could also be determined separately for a specific wire center or area, as show in FIG. 6.

Maximum a-posteriori probability (MAP) estimation is explained. Only the overall loop response model is used. The time-sampled vector pulse response of the correct loop model is r, the "noise" or measurement error vector is n, and the actual measured pulse response vector is d=r+n. The measurement error is assumed to be white Gaussian noise, so the ML estimator minimizes the squared error. Loop gauge probabilities are now incorporated with a maximum a-posteriori probability (MAP) estimator at step 140. Let $\hat{r}$ be a possible estimate of the gauge of the next section. The prior probabilities $p_R(\hat{r})$ of each gauge are determined by assuming that the working length is the sum length of all previously estimated loop sections. The MAP estimator selects $\hat{r}$ to maximize the a-posteriori probability $$P_{R|D}(\hat{r}|d) = \frac{f_{D|R}(d|\hat{r})p_R(\hat{r})}{f_D(d)} \qquad (1)$$

where $f( )$ is the probability density function. The denominator is not a function of $\hat{r}$ so only $f_{D/R}(d|\hat{r})p_R(\hat{r})$ needs to be maximized. The noise $n=d-r$ is Gaussian so $$f_{D|R}(d|\hat{r}) = \frac{1}{(2\pi)^{M/2}\sigma^M} \exp\left(-\frac{1}{2\sigma^2}\|d-\hat{r}\|^2\right) \quad (2)$$

where M is length of the vectors, $\sigma$ is the standard deviation of the "noise" or measurement error, and $$\|d-\hat{r}\|^2 = \sum_{i=1}^{M} |d_i - \hat{r}_i|^2$$

is the sum squared error (SSE). The MAP estimator maximizes $f_{D/R}(d|\hat{r})p_R(\hat{r})$, which is the same as maximizing its natural logarithm, $\ln(f_{D/R}(d|\hat{r})p_R(\hat{r}))$, and is equivalent to minimizing $$\|d-\hat{r}\|^2 - 2\sigma^2 \ln(p_R(\hat{r})) \quad (3)$$

Unlike ML estimation, MAP estimation requires knowledge of the standard deviation, $\sigma$, of the measurement error. The standard deviation was calculated using measurements on 45 loops with known make-ups. The MAP estimator essentially increases the SSE by the weighting $-2\sigma^2 \ln(p_R(\hat{r}))$, which is large for unlikely gauges with small $p_R(\hat{r})$. The MAP formulas could also be applied to statistics other cable gauge, such as the probabilities of bridged taps versus working sections.

A database of actual loop records was assembled to represent a statistically accurate sample of the loop make-ups, as if records were actually drawn from an actual wire center. The loop record database contains many fields, including the terminal location, the phone number, the loop ID, the status of the loop, the category of service on the loop, the type of pair-gain system on the loop (if any), the cable name, pair number, an indicator as to whether this pair is loaded, as well as the length and gauge information of all the segments of the loop. The sample loop record database used here contains data on 10,000 loops with complete records. The raw data were processed into simple loop make-up descriptions, for example by combining consecutive working sections of the same gauge into one section.

Loop length statistics were drawn from the sample loop database. Loop length distributions generally have long tails with outliers at very long loop lengths, and a concentration of short to medium loop lengths. Loop length statistics can be accurately modeled by a Gamma probability model. The Gamma cumulative distribution function (CDF) is defined as $$Pr(\text{loop length} \leq x) = \int_0^x \frac{1}{\Gamma(\alpha)\beta^\alpha} x^{\alpha-1} e^{-x/\beta} dx$$

with $$\Gamma(\alpha) = \int_0^\infty x^{\alpha-1} e^{-x} dx.$$

Define the mean of the Gamma to be $\mu$, and the standard deviation to be $\sigma$. Then $\mu=\alpha\beta$, $\sigma^2=\alpha\beta^2$, so $\alpha=(\mu^2)/(\sigma^2)$ and $\beta=(\sigma^2)/\mu$.

The working length of a loop is the sum of all cable segment lengths from the CO to the customer location, not including non-working bridged taps. For all 10,000 loops in the sample loop record database, the average working length is 5.60 kft, the standard deviation of the working length is 5.79 kft, the minimum working length is 0.0 kft, and the maximum working length is 50.3 kft. The sample loop database loop working lengths were fit to a Gamma model by equating the first and second moments, with $\alpha=0.935$ and $\beta=5.987$. This Gamma model CDF of loop working lengths was found to be in very good agreement with the histogram of all 10,000 sample loop working lengths.

Figure 6:
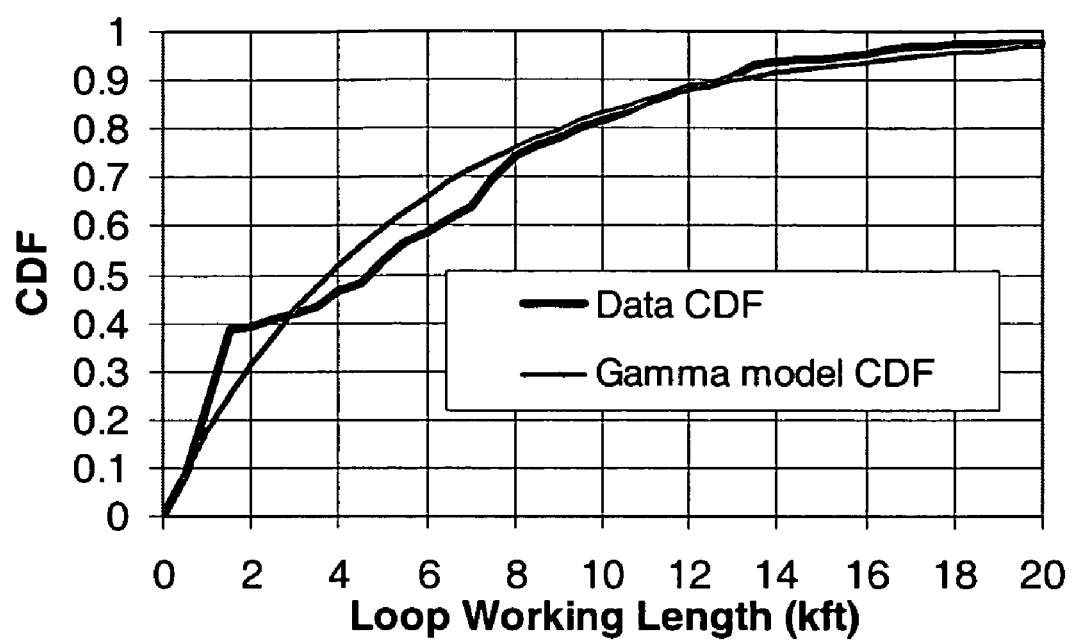
FIG. 6 depicts the cumulative distribution function (CDF) used to identify working length as a function of the total percent of the loop plant at this wire center.

The cumulative distribution function (CDF) found in FIG. 6 was used to identify working length as a function of the total percent of the loop plant at this wire center. The following working lengths were identified: the working length which 5% of loops are no longer than, which 10% of loops are no longer than, which 15% of loops are no longer than, . . . , and which 95% of loops are no longer than. These working lengths are in the first column in Table 3.

Then, a loop make-up in the database was found with about the same working length as that in the first column of Table 3, and is in columns 3–5 of Table 3. These loops were picked to have differing topologies while still being typical. The working lengths are not uniformly distributed, there is some clumping particularly at short 100 or 500 ft lengths, so the percent of loop plant below a working length in Table 3 is only the closest possible approximation.

|  |  | Actual loop make-up | | | Estimated loop make-up | | |
|---|---|---|---|---|---|---|---|
| Working length, feet | Approx. % wire center | 1 = working, 2 = bridged tap | Gauge | Feet | 1 = working, 2 = bridged tap | Gauge | Feet |
| 538 | 5 | 1 | 26 | 538 | 1 | 26 | 547 |
| 640 | 10 | 1 | 24 | 640 | 1 | 24 | 634 |
| 666 | 15 | 1 | 24 | 128 | 1 | 26 | 667 |
|  |  | 1 | 26 | 538 |  |  |  |
| 896 | 20 | 1 | 24 | 640 | 1 | 24 | 636 |
|  |  | 2 | 24 | 256 | 2 | 24 | 252 |
| 1076 | 25 | 1 | 26 | 1076 | 1 | 26 | 1074 |
| 1280 | 30 | 1 | 24 | 896 | 1 | 24 | 886 |
|  |  | 2 | 24 | 384 | 2 | 24 | 377 |
| 1716 | 35 | 1 | 24 | 1076 | 1 | 26 | 622 |
|  |  | 2 | 24 | 640 | 2 | 24 | 1080 |

-continued

| Working length, feet | Approx. % wire center | Actual loop make-up 1 = working, 2 = bridged tap | Gauge | Feet | Estimated loop make-up 1 = working, 2 = bridged tap | Gauge | Feet |
|---|---|---|---|---|---|---|---|
| 2074 | 40 | 1 | 24 | 1536 | 1 | 26 | 1105 |
|  |  | 1 | 26 | 538 |  |  |  |
| 4121 | 45 | 1 | 26 | 1076 | 1 | 24 | 4219 |
|  |  | 1 | 24 | 3045 |  |  |  |
| 4896 | 50 | 1 | 22 | 1561 | 1 | 22 | 4885 |
|  |  | 1 | 24 | 256 |  |  |  |
|  |  | 1 | 22 | 3079 |  |  |  |
| 5246 | 55 | 1 | 26 | 4606 | 1 | 26 | 4557 |
|  |  | 2 | 24 | 640 | 2 | 26 | 640 |
| 6309 | 60 | 1 | 26 | 4133 | 1 | 26 | 4201 |
|  |  | 2 | 24 | 1536 | 2 | 22 | 1431 |
|  |  | 1 | 24 | 1536 | 1 | 24 | 1511 |
|  |  | 2 | 24 | 640 | 2 | 24 | 640 |
| 7650 | 65 | 1 | 24 | 1536 | 1 | 24 | 5443 |
|  |  | 1 | 26 | 6114 | 1 | 22 | 830 |
|  |  |  |  |  | 1 | 26 | 2381 |
| 7790 | 70 | 1 | 24 | 128 | 1 | 26 | 5588 |
|  |  | 1 | 22 | 1000 | 1 | 24 | 650 |
|  |  | 1 | 26 | 538 |  |  |  |
|  |  | 1 | 24 | 3045 |  |  |  |
|  |  | 1 | 22 | 3079 |  |  |  |
| 8702 | 75 | 1 | 24 | 7626 | 1 | 24 | 7563 |
|  |  | 2 | 26 | 1076 | 2 | 26 | 1076 |
| 10707 | 80 | 1 | 26 | 3057 | 1 | 26 | 3262 |
|  |  | 2 | 26 | 1541 | 2 | 24 | 2135 |
|  |  | 1 | 26 | 6114 | 1 | 24 | 3518 |
|  |  | 2 | 24 | 1536 | 2 | 22 | 4950 |
| 10756 | 85 | 1 | 26 | 4598 | 1 | 26 | 5185 |
|  |  | 1 | 22 | 6158 | 1 | 22 | 5345 |
| 12192 | 90 | 1 | 26 | 3057 | 1 | 26 | 3130 |
|  |  | 1 | 22 | 9135 | 1 | 24 | 9157 |
| 15305 | 95 | 1 | 26 | 13769 | 1 | 26 | 15564 |
|  |  | 2 | 26 | 538 |  |  |  |
|  |  | 1 | 24 | 1536 |  |  |  |

There is no bridged tap information in the sample loop database. Bridged taps are typically found on somewhat less than half of all loops, and are typically relatively short. So, a single bridged tap was added to six of the loops, and two bridged taps were added to two of the loops. Finally, the loop make-ups were constructed with loop lengths available in our lab that were very close to those in the sample loop record database.

The actual loop make-ups that were measured are in Table 3. These loops allow the accuracy of the loop identification algorithm to be plotted not only as a function of working length, but also as a function of the percentage of loops at the wire center.

Loops made of aircore PIC cable were connected together in the lab and single-ended enhanced TDR measurements were taken. For the measurements we did not use a conventional TDR but we assembled a TDR that allowed us to perform differential probing. In our experiments, we noted that differential probing drastically enhances the quality of the measurements compared to conventional TDRs, which use unbalanced probing, since it ensures only one mode of propagation.

The probing signal used in our experiments is a simple square pulse 1 or to 3 microseconds wide, with a 5 ns rise and fall time, and a 5 Volts over 100 ohm differential amplitude. The far end of the loop was left unterminated to simulate the high input impedance of a conventional on-hook telephone. Loop identification proceeds using an automated software routine which has no information on the loop make-ups other than their measurements. The multiple path search algorithm, nominally with two paths, was conducted.

The actual individual loop make-ups are compared to their estimates in Table 3. A bridged tap on the end of a loop is the same topology as if the bridged tap were considered a working section, so the length of these end bridged taps were added to the working length. Only one of the loop working length estimates is off by over 20%.

Figure 7:
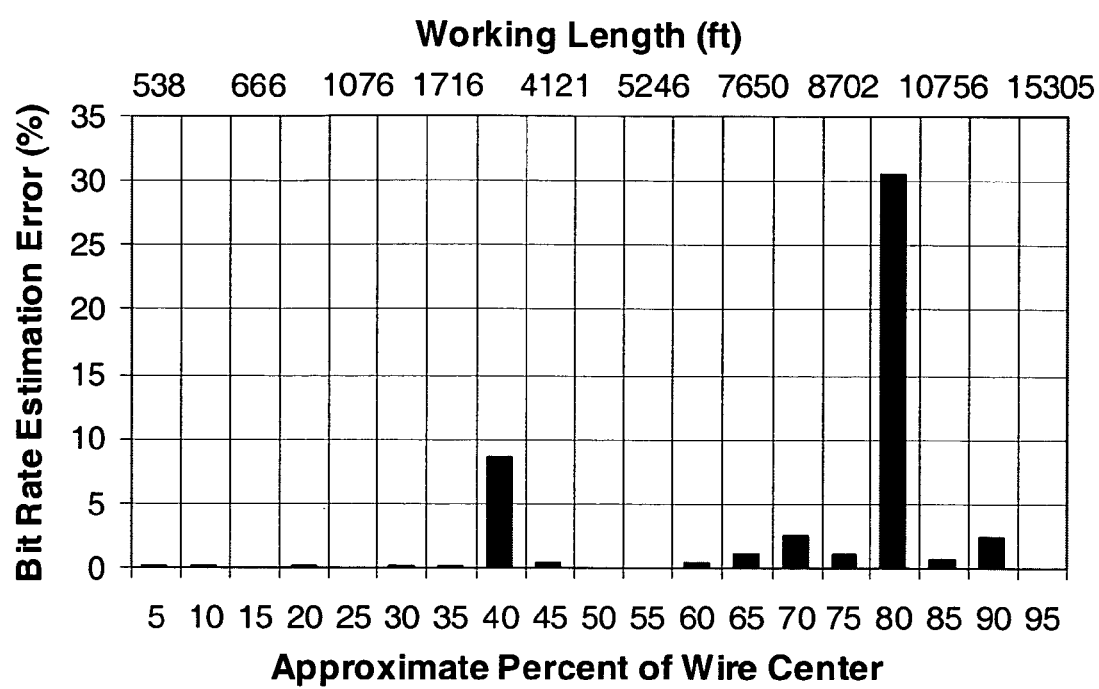
FIG. 7 depicts results of the identification process on the 19 test loops representing a wire center.

We have chosen also another metric to describe the quality of the identification, the difference between the bit rates of an ADSL system running on a loop exhibiting the actual and the estimated topology. This allows us to understand how far the actual and estimated topologies are from a DSL qualification perspective. ADSL bit rates were calculated with twelve spectrum management Class 1 disturbers plus twelve self-crosstalk disturbers. Results of such identification on the 19 test loops representing the wire center are shown in FIG. 7. The ADSL bit-rate estimates are usually very accurate, and only one of the ADSL bit-rate estimates is off by over 20%.

The accuracy of the system can also be improved using a calibration procedure. A calibration procedure is performed to account for persistent constant differences between the measurements and the model. The response is measured with the equipment connected to a very long cable and the difference between the model with a long cable and this measured response is calculated and called the "null response." This null response is calculated separately for each cable gauge (19, 22, 24, and 26 AWG), and the separate null response files are used for each estimated first loop section gauge. The method of the present invention in a preferred embodiment calibrates the input data file by subtracting out the calibration ratio times the null response, with the calibration ratio equal to approximately 0.8 and the null response equal to the average difference between the model and the measurement on a long cable. The null response is calculated and stored before individual loop echo data is acquired, prior to step 110. The calibration subtraction is performed immediately after individual loop echo data is acquired in step 110, but before any loop identification is performed.

The above description has been presented only to illustrate and describe the invention. It is not intended to be exhaustive or to limit the invention to any precise form disclosed. Many modifications and variations are possible in light of the above teaching. The applications described were chosen and described in order to best explain the principles of the invention and its practical application to enable others skilled in the art to best utilize the invention on various applications and with various modifications as are suited to the particular use contemplated.

What is claimed is:

1. A method for identifying the makeup of a subscriber loop including a cable having one or more discontinuities thereon wherein said subscriber loop is a loop in a loop plant, said method comprising the steps of:
    transmitting a probing pulse on the loop and acquiring data based on receiving echoes caused by the discontinuities on the loop;
    hypothesizing a representative set of topologies of the loop based on the acquired data resulting from the discontinuities;
    computing a corresponding waveform for each of the hypothesized discontinuities; and,
    comparing each computed waveform to the acquired data and choosing the topology whose corresponding waveform best matches the acquired data using a multiple path search.

2. The method of claim 1 further comprising the steps of:
    subtracting the waveform corresponding to the chosen topology from the acquired data to produce compensated data;
    finding a next echo present in the compensated data;
    iteratively repeating said hypothesizing, computing, comparing and subtracting steps for each discontinuity in the loop until no echoes are found; and,
    identifying the presence or absence and location of one or more gauge changes and bridged taps, the length of the loop including the length of each bridged tap, and the gauge of each loop section.

3. The method of claim 1 wherein the comparing step further comprises the used of maximum a-posteriori probability (MAP) estimation taking into account knowledge regarding the loop plant to choose the topology whose corresponding waveform best matches the acquired data.

4. The method of claim 1 wherein the step of transmitting and acquiring data further comprises the step of calibrating the acquired data based on a calibration ratio and a null response for each gauge.

5. The method of claim 1 wherein the branch and band technique issued to limit the number of paths searched in the comparing step.

6. A system for identifying the makeup of a subscriber loop including a cable having one or more discontinuities thereon wherein said subscriber loop is a loop in a loop plant, said method comprising:
    a probe for transmitting a pulse on the subscriber loop and for acquiring data based on received echoes caused by the discontinuities on the loop;
    a means for hypothesizing a representative set of topologies of the loop based on the acquired data resulting from the discontinuities;
    a means for computing a corresponding waveform for each of the hypothesized discontinuities; and,
    a means for comparing each computed waveform to the acquired data and choosing the topology whose corresponding waveform best matches the acquired data using a multiple path search.

7. The system of claim 6 further comprising:
    a means for subtracting the waveform corresponding to the chosen topology from the acquired data to produce compensated data;
    a means for finding a next echo present in the compensated data; and,
    a means for identifying the presence or absence and location of one or more gauge changes and bridged taps, the length of the loop including the length of each bridged tap, and the gauge of each loop section.

8. The system of claim 6 further comprising a maximum a-posteriori probability (MAP) estimator for taking into account knowledge regarding the loop plant to choose the topology whose corresponding waveform best matches the acquired data.

9. The system of claim 6 further comprising a means for calibrating the acquired data based on a calibration ratio and a null response for each gauge.

10. The system of claim 6 wherein the branch and band technique is used to limit the number of paths searched by the comparing means.

* * * * *